(12) United States Patent
Torimi et al.

(10) Patent No.: US 9,704,733 B2
(45) Date of Patent: Jul. 11, 2017

(54) STORING CONTAINER, STORING CONTAINER MANUFACTURING METHOD, SEMICONDUCTOR MANUFACTURING METHOD, AND SEMICONDUCTOR MANUFACTURING APPARATUS

(71) Applicant: TOYO TANSO CO., LTD., Osaka-shi, Osaka (JP)

(72) Inventors: Satoshi Torimi, Kanonji (JP); Norihito Yabuki, Kanonji (JP); Satoru Nogami, Kanonji (JP)

(73) Assignee: TOYO TANSO CO., LTD., Osaka (JP)

( * ) Notice: Subject to any disclaimer, the term of this patent is extended or adjusted under 35 U.S.C. 154(b) by 0 days.

(21) Appl. No.: 14/434,864

(22) PCT Filed: Nov. 15, 2013

(86) PCT No.: PCT/JP2013/006721
§ 371 (c)(1),
(2) Date: Apr. 10, 2015

(87) PCT Pub. No.: WO2014/076964
PCT Pub. Date: May 22, 2014

(65) Prior Publication Data
US 2015/0255314 A1 Sep. 10, 2015

(30) Foreign Application Priority Data
Nov. 16, 2012 (JP) .................................. 2012-252754

(51) Int. Cl.
*H01L 21/02* (2006.01)
*H01L 21/673* (2006.01)
(Continued)

(52) U.S. Cl.
CPC ............ *H01L 21/673* (2013.01); *C23C 10/02* (2013.01); *C23C 10/22* (2013.01); *C30B 29/36* (2013.01);
(Continued)

(58) Field of Classification Search
USPC ......................................... 428/472, 698, 469
See application file for complete search history.

(56) References Cited

U.S. PATENT DOCUMENTS

| | | | |
|---|---|---|---|
| 2002/0083890 A1 | 7/2002 | Vodakov et al. | |
| 2006/0249073 A1 | 11/2006 | Asaoka et al. | |

(Continued)

FOREIGN PATENT DOCUMENTS

| | | | |
|---|---|---|---|
| EP | 2 439 308 A1 | 4/2012 | |
| JP | 2-47258 A | 2/1990 | |

(Continued)

OTHER PUBLICATIONS

International Search Report dated Feb. 18, 2014, issued in corresponding application No. PCT/JP2013/006721.
(Continued)

*Primary Examiner* — Archene Turner
(74) *Attorney, Agent, or Firm* — Westerman, Hattori, Daniels & Adrian, LLP

(57) ABSTRACT

The present invention is to provide a storing container wherein Si does not drop onto a single crystal SiC substrate, and Si pressure distribution in an internal space can be made uniform. This storing container stores therein a single crystal SiC substrate to be etched by means of a heat treatment under Si vapor pressure. The storing container is formed of a tantalum metal, and has a tantalum carbide layer provided on an internal space side, and a tantalum silicide layer provided on the side further toward the internal space side than the tantalum carbide layer. The tantalum silicide layer (Continued)

supplies Si to the internal space. Furthermore, the tantalum silicide layer is different from adhered Si, and does not melt and drop.

7 Claims, 6 Drawing Sheets

(51) Int. Cl.

| | |
|---|---|
| *C30B 29/36* | (2006.01) |
| *C30B 33/12* | (2006.01) |
| *H01L 21/3065* | (2006.01) |
| *H01L 29/16* | (2006.01) |
| *H01L 21/67* | (2006.01) |
| *C30B 35/00* | (2006.01) |
| *H01L 21/04* | (2006.01) |
| *H01L 21/306* | (2006.01) |
| *H01L 21/302* | (2006.01) |
| *C23C 10/22* | (2006.01) |
| *F27B 17/00* | (2006.01) |
| *C23C 10/02* | (2006.01) |

(52) U.S. Cl.
CPC ............ *C30B 33/12* (2013.01); *C30B 35/002* (2013.01); *F27B 17/0025* (2013.01); *H01L 21/046* (2013.01); *H01L 21/302* (2013.01); *H01L 21/3065* (2013.01); *H01L 21/30604* (2013.01); *H01L 21/6719* (2013.01); *H01L 21/67069* (2013.01); *H01L 29/1608* (2013.01)

(56) References Cited

U.S. PATENT DOCUMENTS

| | | | |
|---|---|---|---|
| 2010/0044721 A1 | 2/2010 | Fujikawa et al. | |
| 2012/0067462 A1* | 3/2012 | Abe | ........................ C23C 8/64 148/223 |

FOREIGN PATENT DOCUMENTS

| | | | |
|---|---|---|---|
| JP | 11-87257 A | | 3/1999 |
| JP | 2003-234313 A | | 8/2003 |
| JP | 2008-16691 A | | 1/2008 |
| JP | 2008-34464 A | | 2/2008 |
| JP | 2008-230944 A | | 10/2008 |
| JP | 2009-146997 A | | 7/2009 |
| JP | 2009-272328 A | | 11/2009 |
| JP | 2010-265126 A | | 11/2010 |
| JP | 2011-233780 A | | 11/2011 |
| KR | 100822302 | * | 4/2008 |

OTHER PUBLICATIONS

Extended (Supplementary) European Search Report dated May 19, 2016, issued in counterpart European Patent Application No. 13855882.0. (6 pages).

Office Action dated Aug. 8, 2016, issued in counterpart Chinese Patent Application No. 201380059730.2, with English translation. (9 pages).

Office Action dated Aug. 24, 2016, issued in counterpart Japanese Patent Application No. 2012-252754, with English translation. (6 pages).

* cited by examiner (a) FORMING EPITAXIAL LAYER (b) IMPLANTING IONS (c) AFTER ION IMPLANTATION (d) DURING ETCHING
(ION ACTIVATION, PLANARIZATION)

(e) AFTER ETCHING
(ETCHING OF INSUFFICIENT ION-IMPLANTED PORTION IS COMPLETED)

STORING CONTAINER, STORING CONTAINER MANUFACTURING METHOD, SEMICONDUCTOR MANUFACTURING METHOD, AND SEMICONDUCTOR MANUFACTURING APPARATUS

TECHNICAL FIELD

The present invention relates mainly to a storing container, in etching a surface of a single crystal SiC substrate, for storing the single crystal SiC substrate.

BACKGROUND ART

SiC, which is superior to Si etc., in terms of heat resistance, mechanical strength, and the like, has been attracting attention as a new semiconductor material. Some single crystal SiC substrate may originally contain, in its surface, crystal defects or the like.

Patent Document 1 discloses a surface planarization method for planarizing (repairing) a surface of a single crystal SiC substrate. The surface planarization method includes forming a carbonized layer and a sacrificial growth layer on a single crystal SiC substrate, and etching the sacrificial growth layer, for surface planarization. This can produce a high-quality seed substrate for epitaxial growth.

When the sacrificial growth layer is formed, a heat treatment under Si vapor pressure is needed. In Patent Document 1, a storing container shown in FIG. 6 is used for being caused Si vapor pressure. As shown in FIG. 6, a storing container 90 for storing a single crystal SiC substrate 94 includes an upper container 91 and a lower container 92 being fittable to each other. Si 93 is adhered to a wall surface that defines an internal space in the upper container 91 and the lower container 92. This configuration allows Si 93 to be evaporated during the heat treatment. Accordingly, Si vapor pressure can be generated in the internal space of the storing container 90.

In general, a seed crystal produced in the above-described manner is subjected to treatments including epitaxial growth, ion implantation, ion activation, and the like.

Patent Document 2 discloses a method for suppressing sublimation of Si and SiC during ion activation, by performing the ion activation after a carbonized layer (graphene cap) is formed on a surface of a single crystal SiC substrate. After that, with this method, the carbonized layer is removed and the surface of the single crystal SiC substrate is etched under Si vapor pressure in order to remove an insufficient ion-implanted portion. Patent Document 2 discloses a method for placing Si pellets in the storing container in order to be caused Si vapor pressure.

PRIOR-ART DOCUMENTS

Patent Documents

Patent Document 1: Japanese Patent Application Laid-Open No. 2008-230944
Patent Document 2: Japanese Patent Application Laid-Open No. 2011-233780

SUMMARY OF THE INVENTION

Problems to be Solved by the Invention

In the case which Si is adhered to the wall surface of the internal space as shown in Patent Document 1, however, Si may be melt during the heat treatment. Particularly, when Si adhered to the wall surface at an upper side of the internal space is melt, Si is dropped onto the single crystal SiC substrate. When Si is not adhered to the wall surface at the upper side of the internal space, Si pressure distribution is ununiform so that the heat treatment cannot be properly performed.

Although Si pellets are placed in the storing container in Patent Document 2, Si pressure distribution is made ununiform so that the heat treatment cannot be properly performed. Therefore, in Patent Document 1 and Patent Document 2, the etching cannot be performed uniformly.

In Patent Document 2, the steps of forming and removing the carbonized layer are needed and therefore the steps are complicated.

The present invention has been made in view of the circumstances described above, and a primary object of the present invention is to provide a storing container wherein Si does not drop onto a single crystal SiC substrate, and Si pressure distribution in an internal space can be made uniform.

Means for Solving the Problems and Effects Thereof

Problems to be solved by the present invention are as described above, and next, means for solving the problems and effects thereof will be described.

In a first aspect of the present invention, a storing container for storing therein a single crystal SiC substrate to be etched by a heat treatment under Si vapor pressure is provided. The storing container is formed of a tantalum metal, and has a tantalum carbide layer provided on an internal space side, and a tantalum silicide layer provided on the side further toward the internal space side than the tantalum carbide layer.

The conventional configuration in which Si is adhered to an inner surface of a storage container for the supply of Si may cause Si to melt, which causes adverse effects on the single crystal SiC substrate. However, the configuration of the present application in which the tantalum silicide layer is provided for the supply of Si to the internal space can prevent such adverse effects.

In the storing container, it is preferable that the tantalum silicide layer is provided on at least the wall surface at an upper side of the single crystal SiC substrate stored in the storing container.

Accordingly, dropping molten Si on the single crystal SiC substrate is prevented and Si vapor pressure can be caused.

In the storing container, it is preferable that the tantalum silicide layer is provided over an entire wall surface that defines an internal space.

This allows Si pressure in the internal space to be uniform, and therefore the etching can be performed uniformly.

In an etching step of removing an insufficient ion-implanted portion of a surface of the single crystal SiC substrate in which ions are implanted, it is preferable that the storing container is used for storing the single crystal SiC substrate.

Accordingly, in the etching step of removing the insufficient ion-implanted portion, the above-described effects can be exerted. Si pressure of the internal space is uniform so that a carbonization of the single crystal SiC substrate can be controlled.

This enables an ion activation treatment to perform without forming a carbonized layer (graphene cap).

In the etching step of being performed on the single crystal SiC substrate before forming an epitaxial layer, it is preferable that the storing container is used for storing the single crystal SiC substrate.

Accordingly, during the etching before forming an epitaxial layer, the above-described effects can be exerted.

In the storing container, it is preferable that the tantalum silicide layer having a thickness of one μm to 300 μm is provided.

The tantalum silicide layer having the above-described thickness is provided so that Si supplied to the internal space is sufficiently ensured, and a crack of the storing container can be properly prevented.

In the storing container, it is preferable that the tantalum silicide layer is formed of $TaSi_2$.

Accordingly, the tantalum silicide layer can be provided only by contacting molten Si and heating it.

In a second aspect of the present invention, a method for manufacturing a storing container for storing therein a single crystal SiC substrate to be etched by means of a heat treatment under Si vapor pressure is provided. The manufacturing method includes the step of forming a tantalum silicide layer by heating while bringing molten Si into contact with a tantalum carbide layer included in a part of the storing container.

Accordingly, the storing container in which Si does not melt during the heat treatment can be easily manufactured at a low cost.

In a third aspect of the present invention, a method for manufacturing a semiconductor in which the etching is performed by means of a heat treatment under Si vapor pressure by using the above-described storing container is provided.

Accordingly, the etching is performed and then a semiconductor can be manufactured while the above-described effects can be exerted.

In a fourth aspect of the present invention, an apparatus for manufacturing a semiconductor having the storing container is provided.

Accordingly, an apparatus for manufacturing a semiconductor, that can exert the above-described effects, is achieved.

EMBODIMENT FOR CARRYING OUT THE INVENTION

Next, an embodiment of the present invention will be described with reference to the drawings.

Figure 1:
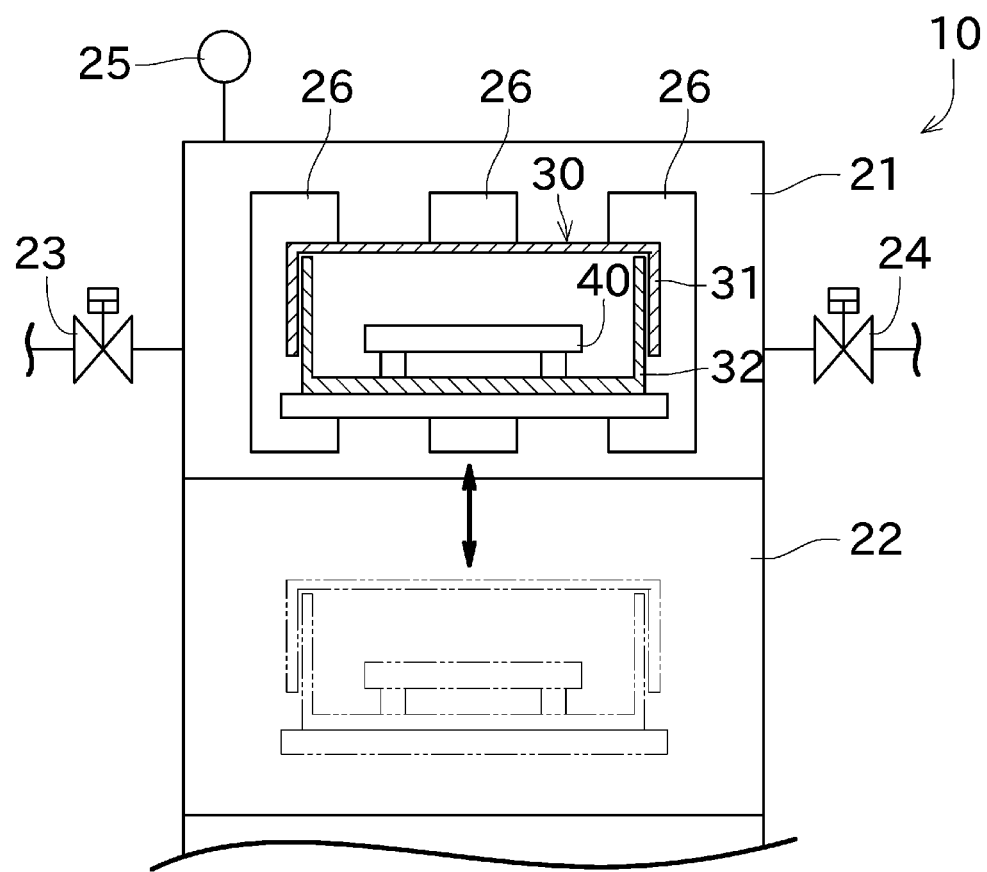
FIG. 1 A diagram for illustration of an outline of a high-temperature vacuum furnace for use in a surface treatment method according to the present invention.
Figure 2:
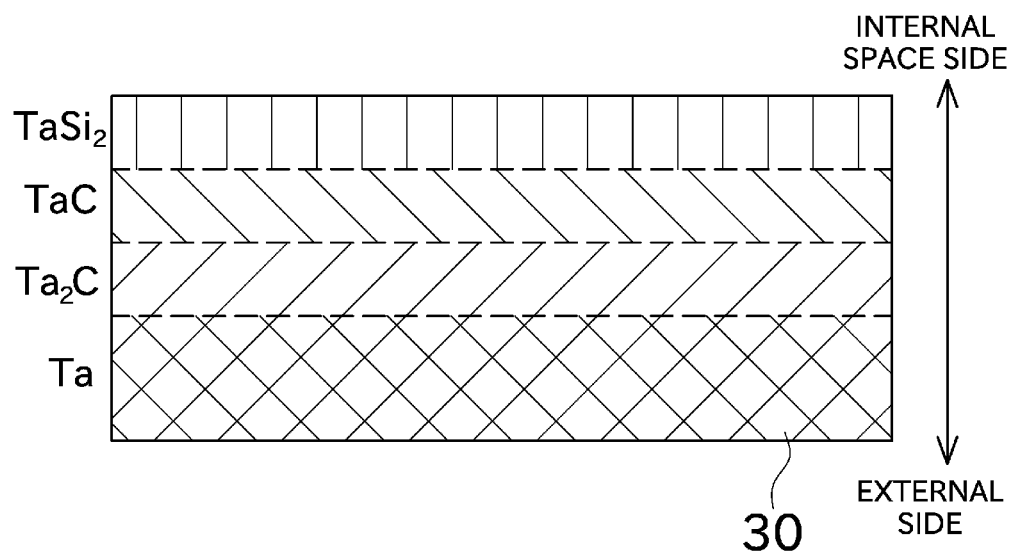
FIG. 2 A diagram showing a configuration of a crucible.

Firstly, referring to FIG. 1, a high-temperature vacuum furnace (apparatus for manufacturing a semiconductor) 10 and a crucible 30 for using a heat treatment of this embodiment will be described. FIG. 1 is a diagram for illustration of an outline of a high-temperature vacuum furnace for use in a surface treatment method. FIG. 2 is a diagram showing a configuration of a crucible 30.

As shown in FIG. 1, the high-temperature vacuum furnace 10 includes a main heating chamber 21 and a preheating chamber 22. The main heating chamber 21 is configured to heat a single crystal SiC substrate up to a temperature of 1000° C. or more and 2300° C. or less. The preheating chamber 22 is a space for preheating a single crystal SiC substrate prior to heating the single crystal SiC substrate in the main heating chamber 21.

A vacuum application valve 23, an inert gas feed valve 24, and a vacuum meter 25 are connected to the main heating chamber 21. The vacuum application valve 23 is configured to adjust the degree of vacuum of the main heating chamber 21. The inert gas feed valve 24 is configured to adjust pressure of an inert gas (for example, Ar gas) contained in the main heating chamber 21. The vacuum meter 25 is configured to measure the degree of vacuum of the interior of the main heating chamber 21.

A heater 26 is provided in the main heating chamber 21. A heat reflection metal plate (not shown) is fixed to a sidewall and a ceiling of the main heating chamber 21. The heat reflection metal plate is configured to reflect heat of the heater 26 toward a central area of the main heating chamber 21. This is able to strongly and uniformly heat the single crystal SiC substrate and raise its temperature up to 1000° C. or more and 2300° C. or less. For example, a heater of resistive heating type or a heater of high-frequency induction type is adoptable as the heater 26.

The single crystal SiC substrate is heated while stored in a crucible (storing container) 30. The crucible 30 is placed on an appropriate support or the like, and the support is movable at least in a range from the preheating chamber to the main heating chamber.

The crucible 30 includes an upper container 31 and a lower container 32 that are fittable with each other. As shown in FIG. 2, in the crucible 30, a tantalum layer (Ta), tantalum carbide layers (TaC and $Ta_2C$), and a tantalum silicide layer ($TaSi_2$) are provided in this order from an external side to an internal space side of the crucible 30.

A crucible including the tantalum layer and the tantalum carbide layer has been conventionally known. In the crucible 30 of this embodiment, the tantalum silicide layer is additionally formed. The tantalum silicide layer is provided for applying Si vapor pressure in the internal space of the crucible 30, and corresponds to Si adhered to an inner wall of the Patent Document 1 and Si pellets of Patent Document 2.

A method for forming a tantalum silicide layer will be described below. The tantalum silicide layer is formed by bringing molten Si into contact with an inner wall surface of a crucible and heating it at about 1800° C. or more and 2000° C. or less. Thereby, the tantalum silicide layer made of $TaSi_2$ is formed. In this embodiment, the tantalum silicide layer having a thickness of about 30 μm to 50 μm is formed. Depending on the volume of the internal space, etc., the tantalum silicide layer having a thickness of, for example, one μm to 300 μm may be formed.

The tantalum silicide layer can be formed through the above-described process.

Figure 3:
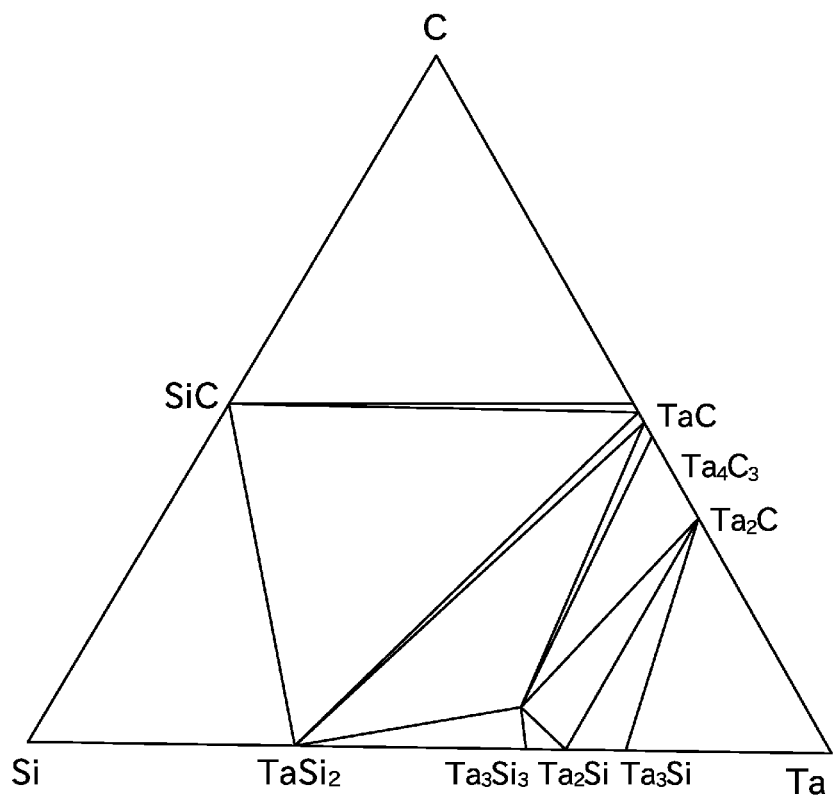
FIG. 3 A phase diagram of Ta, Si and C under 1 atm of 1000° C.

Although this embodiment adopts $TaSi_2$ as tantalum silicide, tantalum silicide represented by another chemical formula (for example, tantalum silicide showing a phase diagram of FIG. 3) is also adoptable. A plurality of types of tantalum silicide laminated one on another is also acceptable.

Figure 4:
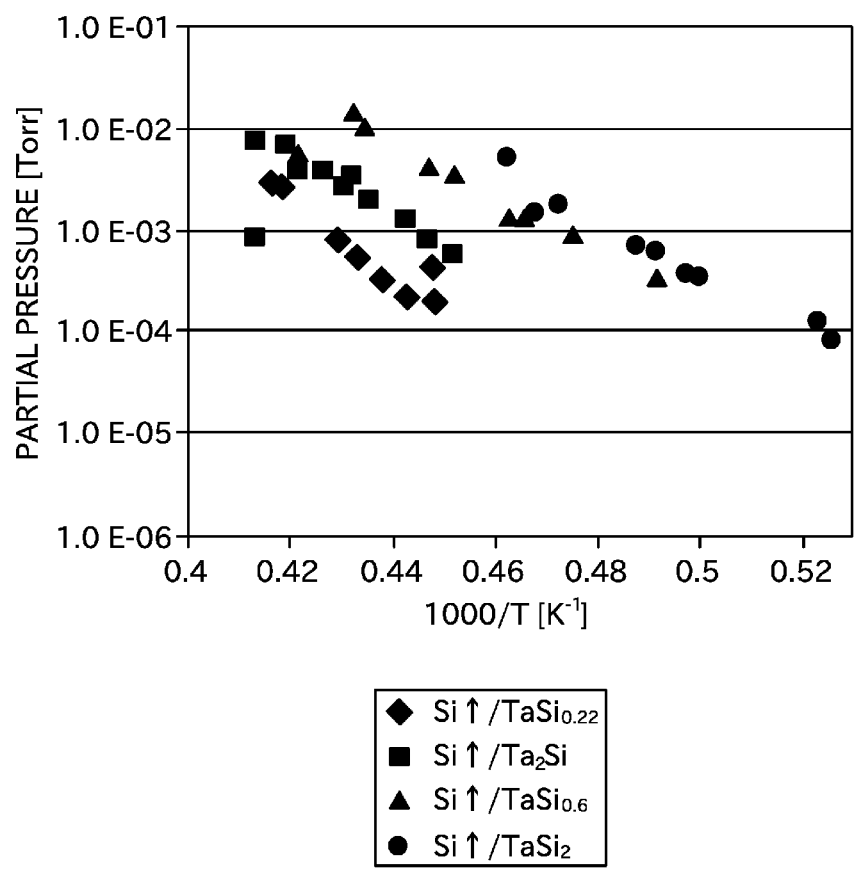
FIG. 4 A graph showing a heat temperature and a partial pressure of Si vapor pressure sublimated from a tantalum silicide.

FIG. 4 is a graph showing a heat temperature and a partial pressure of Si vapor pressure sublimated from a tantalum silicide. As shown in FIG. 4, the pressure of Si vapor pressure sublimated from the tantalum silicide is relatively high. Moreover, the tantalum silicide layer is provided over an entire wall surface that defines the internal space (naturally, an upper wall surface of the single crystal SiC substrate 40 is included). This allows Si pressure distribution in the internal space to be uniform.

To perform a heat treatment on the single crystal SiC substrate, the crucible 30 is firstly placed in the preheating chamber 22 of the high-temperature vacuum furnace 10 as indicated by the dot-dash lines in FIG. 1, and preheated at an appropriate temperature (for example, about 800° C.). Then, the crucible 30 is moved to the main heating chamber 21 whose temperature has been elevated to a set temperature (for example, about 1800° C.) in advance.

Figure 5:
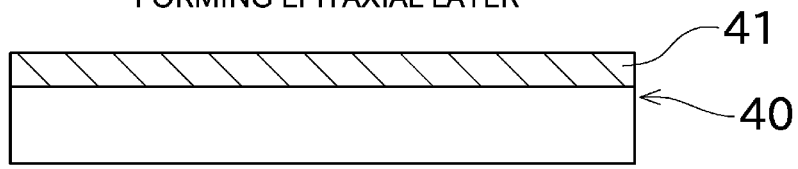
FIG. 5 Diagrams schematically showing the state of a substrate in each step.
Figure 5:
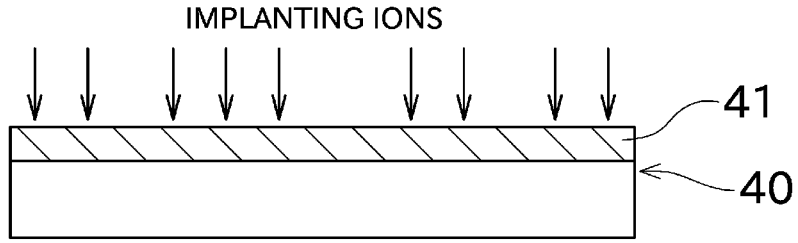
Figure 5:
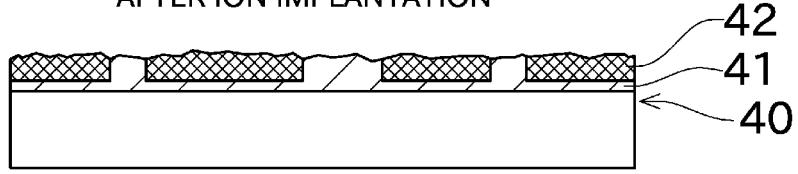
Figure 5:
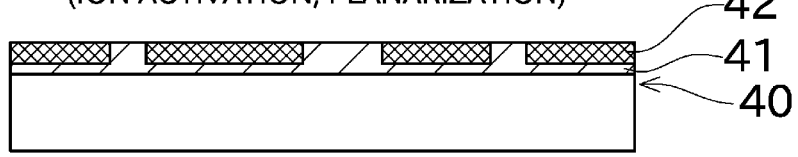
Figure 5:
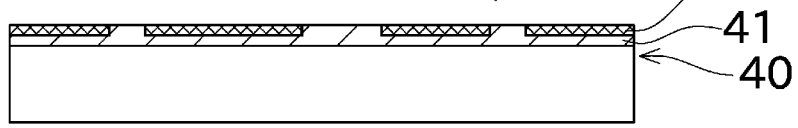
Figure 6:
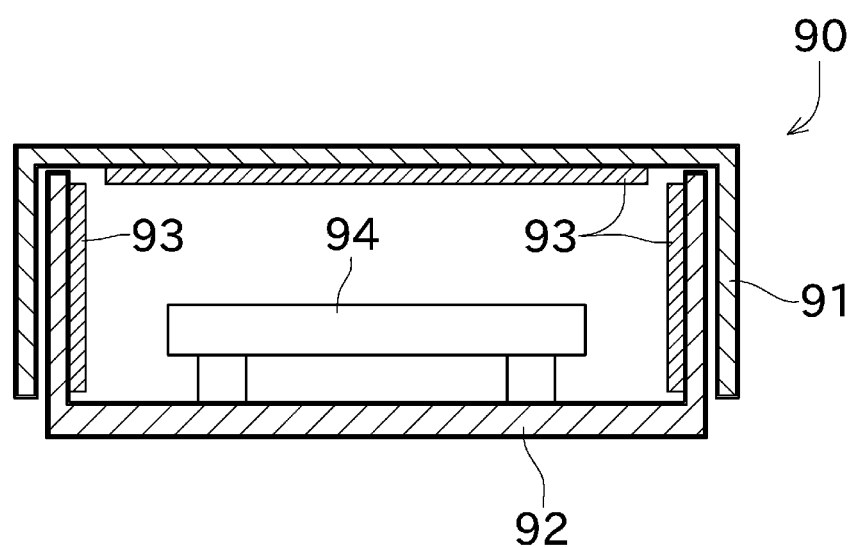
FIG. 6 A diagram schematically showing a configuration of a storing container in the conventional invention.

Next, referring to FIG. 5, a description will be given of a process of manufacturing a semiconductor device from the single crystal SiC substrate 40 by using the high-temperature vacuum furnace 10 described above. FIG. 5 are diagrams schematically showing the state of a substrate in each step.

Firstly, as shown in FIG. 5 (a), an epitaxial layer 41 is formed on the single crystal SiC substrate 40. Any method is adoptable for forming the epitaxial layer. For example, the known vapor phase epitaxy or metastable solvent epitaxy is adoptable. In a case where the single crystal SiC substrate 40 is an off-angled substrate, the CVD process that forms an epitaxial layer based on a step-flow control is also adoptable.

Then, as shown in FIG. 5 (b), the single crystal SiC substrate 40 having the epitaxial layer 41 formed thereon is implanted with ions. This ion implantation is performed with an ion-doping apparatus having a function of irradiating an object with ions. The ion-doping apparatus selectively implants ions int the whole or a part of the surface of the epitaxial layer 41. A desired region of a semiconductor device is formed based on an ion-implanted portion 42 where ions are implanted.

As a result of the ion implantation, the surface of the epitaxial layer 41 including the ion-implanted portions 42 is roughened (the surface of the single crystal SiC substrate 40 is damaged so that the degree of planarity deteriorates), as shown in FIG. 5 (c).

Then, an activation of the implanted ions and the etching of the ion-implanted portions 42 and the like are performed. In this embodiment, these two processes can be performed in a single step. More specifically, a heat treatment (annealing) is performed under Si vapor pressure and at a temperature of 1500° C. or more and 2200° C. or less, and desirably 1600° C. or more and 2000° C. or less. This can activate the implanted ions. Additionally, the surface of the single crystal SiC substrate 40 is etched so that the roughened portions of the ion-implanted portions 42 are planarized (see FIG. 5 (d)).

To be planarized, the following reactions are performed.

SiC(s)→Si(v)I+C(s)   (1)

2SiC(s)→Si(v)II+SiC$_2$(v)   (2)

SiC(s)+Si(v)I+II→Si$_2$C(v)   (3)

C(s)I+2Si(v)→Si$_2$C(v)   (4)

As described above, Si pressure distribution in the internal space of the crucible 30 can be made uniform in this embodiment. The tantalum silicide layer is provided on the wall surface that defines the internal space. This allows Si to be immediately supplied even when Si is decreased by such as the chemical formulas (3) and (4). Accordingly, the internal space always keeps Si vapor pressure. Therefore, the reaction of the chemical formulas (1) and (2) hardly occurs, so that the surface of the single crystal SiC substrate 40 can be etched while controlling the carbonization of the the surface of the single crystal SiC substrate 40.

Accordingly, unlike Patent Document 2, using the crucible 30 of this embodiment makes it unnecessary to form a carbonized layer (graphene cap). The steps of forming and removing the carbonized layer are omitted, and therefore the treatment can be simplified.

It is known that a portion (insufficient ion-implanted portion) having an insufficient ion concentration appears at a depth of about several tens of nm from the surface of the single crystal SiC substrate 40. Then, the above-described etching is continued until the insufficient ion-implanted portion is removed (see FIG. 5(e)).

The above-described process enables a surface of a semiconductor device having a flatness and a sufficient electrical activity to be formed. The surface of the semiconductor device can be used to manufacture a semiconductor.

As described above, the crucible 30 of this embodiment stores therein the single crystal SiC substrate 40 to be etched by means of the heat treatment under Si vapor pressure. The crucible 30 is formed of a tantalum metal, and has a tantalum carbide layer provided on the internal space side, and a tantalum silicide layer provided on the side further toward the internal space side than the tantalum carbide layer.

Unlike a configuration which Si is adhered, Si does not melt and therefore causing adverse effects on the single crystal SiC substrate 40 can be prevented.

In the crucible 30 of this embodiment, the tantalum silicide layer is provided on at least an upper wall surface of the stored single crystal SiC substrate 40.

Accordingly, Si vapor pressure is achieved while preventing molten Si from being dropped on the single crystal SiC substrate 40.

In the crucible 30 of this embodiment, the tantalum silicide layer is provided over an entire wall surface that defines the internal space.

This allows Si pressure in the internal space to be uniform, and therefore the etching can be performed uniformly.

In the etching step of being performed on the single crystal SiC substrate 40 in which ions are implanted, the crucible 30 of this embodiment is used for storing the single crystal SiC substrate 40.

Accordingly, in the etching step of removing the insufficient ion-implanted portion, the above-described effects can be exerted. In this embodiment, Si pressure in the internal space is uniform so that the carbonization of the single crystal SiC substrate 40 can be controlled. This enables an ion activation treatment to be performed without forming a carbonized layer (graphene cap).

While a preferred embodiment of the present invention has been described above, the above-described configuration can be modified, for example, as follows.

Although this embodiment illustrates the case where the crucible 30 is used for etching after the ion implantation, the above-described control is applicable to a variety of steps that need uniform etching or the like.

As shown in Patent Document 1, for example, a process including forming a carbonized layer and a sacrificial growth layer and then etching the sacrificial growth layer is known as a method for planarizing a substrate (a substrate containing crystal defects and the like) before an epitaxial growth. The crucible 30 of this embodiment can be used for etching the sacrificial growth layer. This enables the sacrificial growth layer to be removed uniformly.

Although the above-described embodiment illustrates the case where the treatment of forming a carbonized layer (graphene cap) is not performed, this treatment may otherwise be performed. After the step of forming the carbonized layer, the carbonized layer can be removed by the above-described chemical formula (4). Therefore, the treatment of removing the carbonized layer, activating an ion, and etching the single crystal SiC substrate can be performed in a single step.

A method for forming a tantalum silicide layer is not limited to the method illustrated in the above-described embodiment. Any method is adoptable as long as the method is able to provide a crucible 30 having the above-described structure (composition).

The environment in which the treatment was performed, the single crystal SiC substrate that was used, and the like, are merely illustrative examples, and the present invention is applicable to various environments and various single crystal SiC substrates. For example, the heat temperature is not limited to the above-described temperature. By reducing temperature, the etching rate can be lower. A heat treatment except for the above-described high-temperature vacuum furnace may be used.

Any shape is adoptable as long as the storing container includes an internal space and the above-described structure (composition). For example, it may be acceptable that an external shape has a cylindrical shape, a cubic shape, or a rectangular parallelepiped shape.

DESCRIPTION OF THE REFERENCE NUMERALS

10 high-temperature vacuum furnace (semiconductor apparatus for manufacturing)
21 main heating chamber
22 preheating chamber
30 crucible (storing container)
40 single crystal SiC substrate
41 epitaxial layer
42 ion-implanted portion

The invention claimed is:

1. A storing container for storing therein a single crystal SiC substrate to be etched by means of a heat treatment under Si vapor pressure, comprising:
    a tantalum metal layer,
    a tantalum carbide layer provided on an internal space side of the tantalum metal layer, and
    a tantalum silicide layer provided on a side further toward the internal space side than the tantalum carbide layer,
    wherein the tantalum silicide layer is provided over an entire wall surface that defines the internal space, and
    wherein the tantalum silicide layer has a thickness of 1 μm to 300 μm.

2. The storing container according to claim 1, wherein the tantalum silicide layer is formed of $TaSi_2$.

3. The storing container according to claim 2, wherein the container includes an upper container and a lower container which are fittable to each other and define the internal space.

4. The storing container according to claim 1, wherein the container includes an upper container and a lower container which are fittable to each other and define the internal space.

5. A method for manufacturing a storing container for storing therein a single crystal SiC substrate to be etched by means of a heat treatment under Si vapor pressure, comprising:
    forming a tantalum silicide layer by heating while bringing molten Si into contact with a tantalum carbide layer included in a part of the storing container,
    wherein the tantalum silicide layer has a thickness of 1 μm to 300 μm.

6. The method according to claim 5, wherein the container includes an upper container and a lower container which are fittable to each other and define an internal space.

7. The method according to claim 5, wherein the tantalum silicide layer is provided over an entire wall surface that defines an internal space.

\* \* \* \* \*